United States Patent [19]
Pattantyus

[11] Patent Number: 5,912,576
[45] Date of Patent: Jun. 15, 1999

[54] CLOCKED REGISTER

[75] Inventor: Tamas I. Pattantyus, Dallas, Tex.

[73] Assignee: AlliedSignal Inc., Morristown, N.J.

[21] Appl. No.: 08/828,737

[22] Filed: Mar. 21, 1997

[51] Int. Cl.$^6$ .................................................. H03K 3/286
[52] U.S. Cl. .......................................... 327/216; 327/217
[58] Field of Search .................................. 327/199, 207, 327/208–212, 214, 215, 216, 217

[56] References Cited

U.S. PATENT DOCUMENTS

| 5,051,621 | 9/1991 | Wright | 327/217 |
| 5,541,544 | 7/1996 | Nakano | 327/217 |

Primary Examiner—Tuan T. Lam

[57] ABSTRACT

A J-K flip/flop type storage register includes an input register and an output register. The input register is active when a clock pulse applied thereto is below a predetermined level defining a logic 0 state and inactive when the clock pulse signal is above the first predetermined level. The output register is active when the level of the clock pulse signal is above a second predetermined level and inactive when the clock pulse signal is below the second predetermined level. There exists a well-defined voltage range during which both the input and output registers are inactive. The transfer of information from the input register to the output register only occurs during the transition from a logic 0 level to a logic 1 level clock pulse signal. The SET and RESET inputs are only enabled when the clock pulse signal is at a logic 0 level. This register management helps to ensure that noise on the clock pulse line does not erroneously trigger the input or output registers and further helps to prevent a race condition from developing between the input and output registers.

21 Claims, 7 Drawing Sheets

CLOCKED REGISTER

CROSS REFERENCE TO RELATED APPLICATIONS

This application is related to U.S. patent application Ser. No. 08/825,875, entitled "Supervisory Integrated Circuit For Anti-lock Brake System Units".

BACKGROUND OF THE INVENTION

1. Technical Field

This invention relates to storage registers, and more particularly to a clocked register of the J-K flip/flop type.

2. Discussion

Storage registers are used in a wide variety of applications to transfer information at precise times to other components of digital and analog circuits. One common type of flip/flop in use is a J-K flip/flop. With the J-K flip/flop, information previously on its "SET" and "RESET" inputs is transferred to its outputs on the trailing edge of a clock pulse applied to a clock input of the flip/flop.

A problem can arise with such flip-flops if there is noise on the clock signal line. In such instances, the register may be fooled into believing that a trailing edge of a clock pulse has occurred when in fact only a noise spike has occurred on the clock pulse align. Accordingly, the register may erroneously respond before the trailing edge of a valid clock pulse is received.

Another problem with storage registers of the J-K flip/flop type is race conditions occurring between an input and an output register of the flip/flop. Such race conditions occur because there is no well-defined voltage range for the clock pulse signal during which both the input and output register of the flip/flop are inactive.

Accordingly, there is a need for a J-K flip/flop type register having input and output registers which are both inactive within a well-defined voltage range of the clock pulse, and which are therefore much less susceptible to spurious operation because of noise on the clock pulse line and race conditions developing between the two registers.

More particularly, there is a need for a J-K flip/flop having an input and an output register, where the input register is only responsive to a clock signal when the clock signal is below a predetermined value, is inactive when the clock signal is above the predetermined value, and where the output register is only responsive to the clock signal when the clock signal is above a second predetermined level. Such a circuit arrangement would provide a J-K flip/flop where the input and output registers are both inactive when the clock pulse signal is between the first and second predetermined levels. This would help insure that the input and output registers will ignore any noise present on the clock pulse line and therefore help to prevent race conditions from developing between the two registers.

SUMMARY OF THE INVENTION

The above and other objects are accomplished by a J-K flip/flop in accordance with preferred embodiments of the present invention. In one preferred embodiment the J-K flip/flop of the present invention incorporates an input register and an output register. The input register includes a pair of inputs and a pair of outputs and the output register includes a pair of inputs responsive to the input register outputs, and also a pair of outputs. When a clock signal applied to a clock input of each register is below a first predetermined level, only the input register is active and the inputs to the output register are inhibited. In this state signals applied to the inputs of the input register are continually setting and resetting the input register as they are changing in time.

When the clock signal exceeds the first predetermined level the input register becomes inactive. When the clock signal increases further to a level above a second predetermined level, the output register becomes active while the input register remains inactive or inhibited. At this point the state of the input register previously copied from its inputs is copied into the output register. When the clock pulse signal changes to a level below the second predetermined level the output register is inhibited. The output register remains inhibited as long as the clock signal is below the second predetermined level yet above the first predetermined level. Once the clock signal drops to a level below the first predetermined level the input register is again enabled while the output register remains inhibited.

With the above circuit arrangement, neither the input or the output register of the flip/flop is active when the clock signal is between the upper and lower predetermined levels. Thus, the flip/flop is much less susceptible to noise on the clock line and race conditions which could develop between the input and output registers. The operation of the input and output registers is therefore managed more efficiently than with previously developed J-K flip/flops.

In one preferred embodiment each of the input and output registers incorporates a common emitter circuit with positive feedback paths. With the input register, the current through one or the other of a pair of transistors of the common emitter circuit is "mirrored" back to the conducting transistor to provide a degree of positive feedback. When one transistor of the common emitter circuit is conducting the other transistor will always be non-conducting and vice versa. The input register also includes a plurality of gates which form two AND-gates. Depending upon the clock signal and the signals at the two inputs of the input register, the AND-gates can be used to control the state of the input register. Advantageously, the output of each AND-gate is a current source which can inject sufficient current into the desired transistor of the common emitter circuit to overcome the effect of the positive feedback acting on the opposite transistor of the common emitter circuit. In this matter the state of the input register can be changed readily.

BRIEF DESCRIPTION OF THE DRAWINGS

The various advantages of the present invention will become apparent to one skilled in the art by reading the following specification and subjoined claims and by referencing the following drawings in which:

DETAILED DESCRIPTION OF THE PREFERRED EMBODIMENTS

Figure 1A:
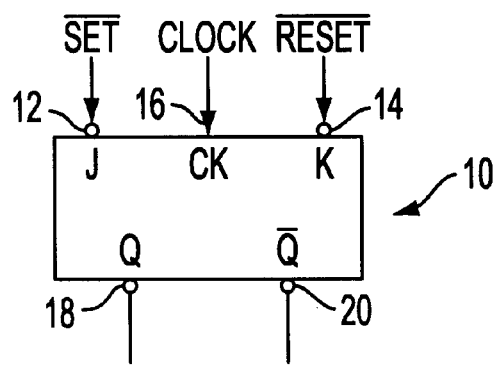
FIG. 1A is a schematic representation of the J-K flip/flop of the present invention.
Figure 1B:
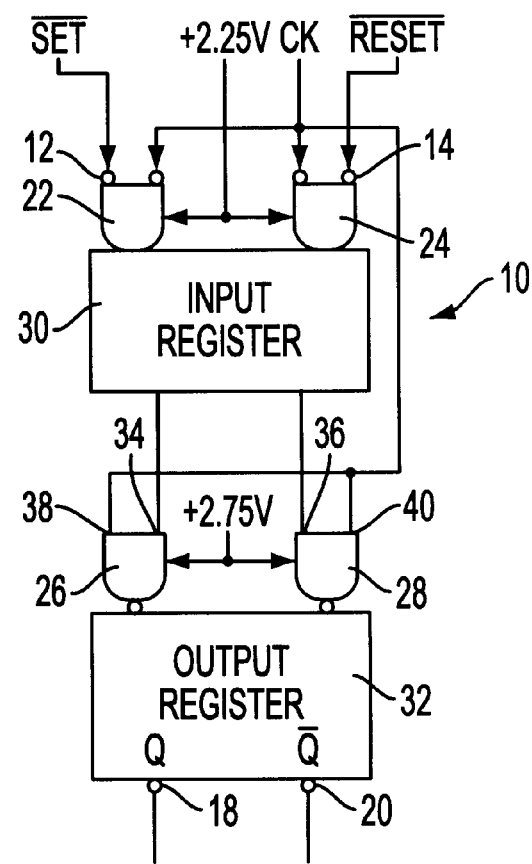
FIG. 1B is a logic representation of the J-K flip/flop of the present invention.

Referring to FIGS. 1A and 1B, there is shown a storage register 10 of the J-K flip/flop type. The register 10 includes a /SET input 12, a /RESET input 14, a clock input 16 and outputs 18 and 20. With specific reference to FIG. 1B, a clock signal is applied to each one of a pair of two input AND-gates 22 and 24, as well as to one input of each of a pair of AND-gates 26 and 28. AND-gates 22 and 24 are associated with an input register 30 while AND-gates 26 and 28 are associated with an output register 32. Each one of AND-gates 26 and 28 have an input 34 and 36, respectively, which form inputs to the output register 32. Inputs 38 and 40 form clock inputs to the output register 32.

With further reference to FIG. 1B, the first or input register stage 30 is active during the inactive state of the clock pulse. This is when the clock pulse is at a logic 0 (or less positive than 2.25 V input level). At this time the inputs to the second or output stage are inhibited. In this state the logic inputs /SET and /RESET are continually setting and resetting the input register 30 as they are changing in time. Notice, that preferably, but not necessarily, /SET=/(/RESET) and /RESET=/(/SET). In other words the /SET and /RESET inputs are logical complements of each other.

As the clock pulse amplitude changes from a level less than 2.25 V (logic 0) to a level more positive than +2.75 V (logic 1), the inputs 12 and 14 to the input register 30 are inhibited when the clock pulse exceeds the +2.25 V level. When the clock pulse amplitude is +2.75 V or greater, the AND-gates 26 and 28 of the output register 32 are enabled and the state of the input register 30 previously copied from its inputs 12 and 14 are copied into the output register 32. As long as the clock pulse level is more positive than +2.25 V the state of the input register 30 is impervious to the states of the /SET 12 and /RESET 14 inputs. As the clock pulse is changing from a level more positive than +2.75 V to a level less positive than +2.25 V, i.e. from logic 1 to logic 0, the state of the output register 32 is frozen and the inputs 12 and 14 to the input register 30 are enabled again.

An important feature of the register 10 is that between logic 0 (<+2.25 V) and logic 1 (>+2.75 V) there is a voltage zone of 0.5 V where a neutral logic exists. As long as the clock pulse state is in the neutral zone neither register 30 or 32 is active. Therefore, race conditions, accidental triggering by noise etc. are prevented. The logic shown in FIGS. 1A and 1B is readily realizable by bi-polar, CMOS or any other well known semiconductor devices.

When both /SET and /RESET inputs are logic 1 (>+2.75 V), the state of the input register 30 will correspond to the last unequal /SET and /RESET inputs 12 and 14, respectively, at logic 0 clock input. This is because /SET=/RESET=logic 1, which case inhibits the input gates 12 and 14 of the input register 30. When both /SET and /RESET are low, both sides of the input register 30 want to store a logic 1, and the side with a slight edge over the other will determine the state as the clock amplitude becomes more positive than +2.25 V. In other words, the response to this input configuration is unpredictable.

Figure 2A:
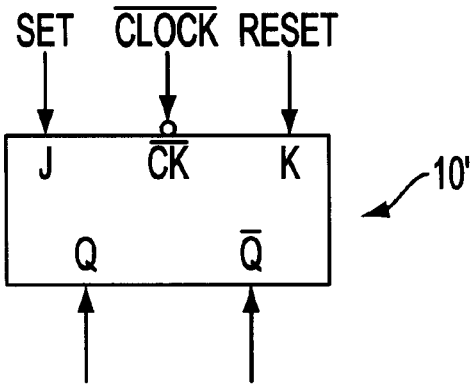
FIG. 2A is a schematic representation of a J-K flip/flop in accordance with an alternative preferred embodiment of the present invention incorporating positive true logic inputs and a negative true clock pulse.
Figure 2B:
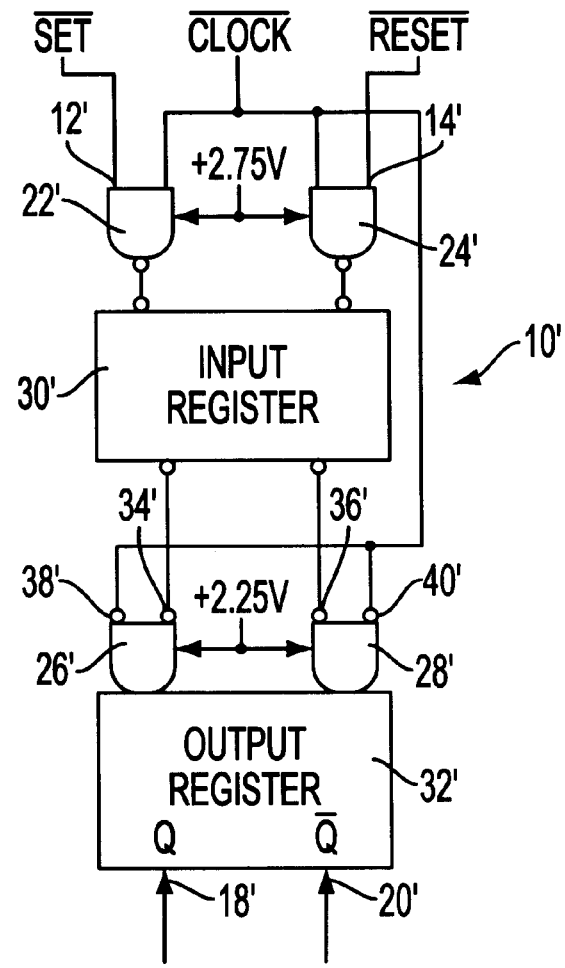
FIG. 2B is a logic diagram of the J-K flip/flop of FIG. 2A.

With brief reference to FIGS. 2A and 2B, an alternative embodiment 10' is illustrated which forms the complement of the register 10. Here the SET and RESET logic inputs 12' and 14', respectively, are positive true and the clock pulse changes from logic 1 (>+2.75 V) to logic 0 (<+2.25 V). All statements and observations made previously will apply in the opposite logic states.

The presently preferred circuit implementation of the register 10 is with a bi-polar linear array. This type of array features a large number of transistor cells which can be configured either as multi-emitter NPN transistors or multi-collector PNP transistors by means of a metal mask. In addition, there are on the die other NPN transistors, large current NPN and PNP transistors and a plurality of resistors of the same value. A plurality of the linear arrays are fabricated on a silicon wafer and the fabrication process is completed except for the step of the inter-connection of the individual transistor cells and resistors corresponding to the custom designed circuit diagram. A metal mask pattern is designed corresponding to the custom circuit and metallization is deposited on the pre-fabricated wafer.

This type of circuit implementation represents the presently preferred practice to realize the invention. However, full custom design CMOS (complementary metal-oxide silicon) linear arrays and full custom CMOS or any combination of bipolar and CMOS circuits are feasible. Thus, it will be appreciated that the invention may be implemented in a variety of forms.

Figure 3:
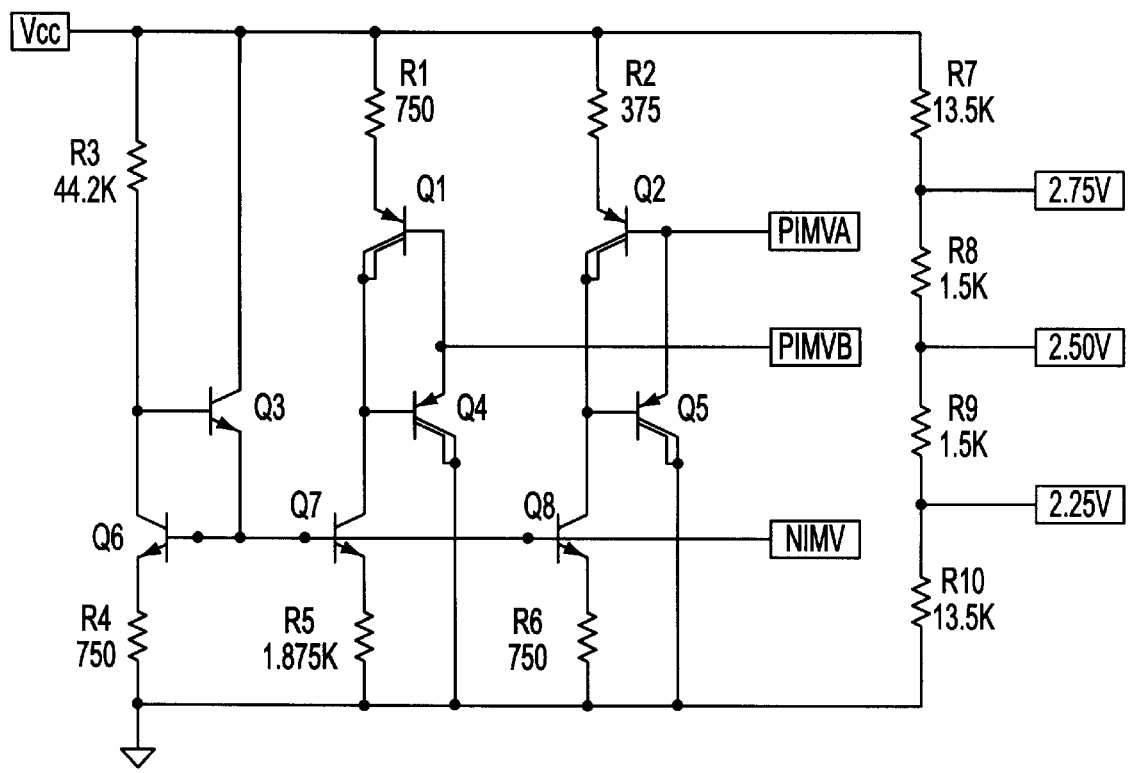
FIG. 3 is a schematic diagram of a circuit for generating the voltages used by the J-K flip/flop of the present invention.

Referring now to FIG. 3, the circuit implementation of both registers 10 and 10' requires the same voltage supply circuit shown in FIG. 3. Supply voltage Vcc is equal to +5.0 V, and reference voltages 2.75 V, 2.50 V and 2.25 V are derived from the resistive voltage divider R7–R10.

Resistors R1–6 and transistors Q1–8 generate current mirror voltages to be used in the actual registers 10 and 10'. Resistors R3–4 and transistors Q3 and Q6 define voltage line NIMV (NPN current mirror voltage). The voltage at the base of transistor Q3 is approximately +1.55 V measured with respect to ground, thus the current through resistor R3 is approximately 81 uA. The base voltage at transistor Q6 therefore corresponds to the 81 uA current through any NPN transistor of the same geometry as Q6 with an emitter resistance of 750 ohms.

Transistor Q8 will also conduct 81 uA. Accordingly, the collector of transistor Q8 "mirrors" the current flowing through transistor Q6. The collector current of transistor Q8 biases PNP transistors Q5 and Q2 so that the base voltage of transistor Q2 (PIMVA: PNP current mirror voltage A) will define 81 uA through any PNP transistor of the same geometry as Q2 with a 375 ohm resistor in its emitter circuit.

Transistor Q7 has a 1.875 kohm resistance tied to its emitter while its base is biased by NIMV, therefore its collector current will be approximately half of that of Q6 or 40 uA. The collector current of transistor Q7 will bias PNP transistors Q1 and Q4 so that the base voltage of Q1 (PIMVB: PNP current mirror voltage B) will define 40 uA through any PNP transistor of the same geometry as Q1 with a 750 ohm resistor in its emitter circuit.

With further reference to FIG. 3, both transistors Q1 and Q2 have their double collectors tied together. Any PNP transistor with double collectors biased by PIMVA or PIMVB will conduct half of the mirrored current through one of its collectors alone. Thus, PIMVA can control two PNP current sources 40 uA each while PIMVB can control two 20 uA PNP current sources 20 uA each. This feature is used in the registers 10 and 10' as described below.

Figure 4A:
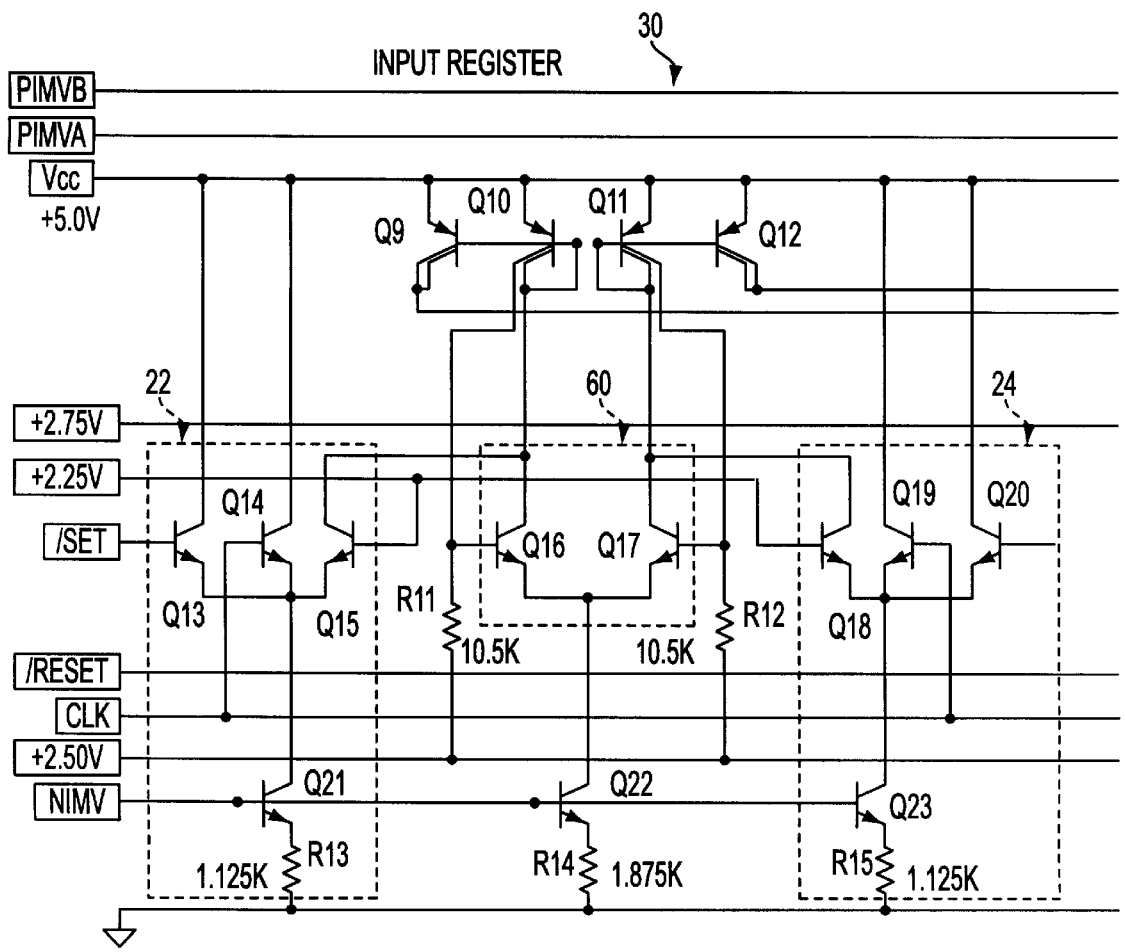
FIG. 4A is a detailed schematic diagram of input register of the J-K flip/flop shown in FIGS. 1A and 1B.

With reference to FIG. 4A, the input register 30 shown in FIG. 1B is shown in greater detail. The input register circuit 30 consists of transistors Q10–11, Q16–17 and Q22, and resistors R11–12 and R14. A 40 uA current is injected into the common emitter circuit 60 of transistors Q16–17 by current mirror Q22 and R14. The common emitter current will flow through either transistor Q16 or Q17. In the first case the collector current of Q16 is mirrored by Q10 back to its own base and returned to the +2.50 V reference line through resistor R11. The voltage drop caused by the mirrored current across R11 is +2.50 V+0.4 V while the voltage at the base of the other side is at +2.50 V. The positive feedback represented by the mirrored collector current back to its own base firmly locks the state of the register 10 such that transistor Q16 is conducting and Q17 is not. This state is said to be the SET state of the input register. In the RESET state, transistor Q17 is conducting and Q16 is not.
The state of the input register can be changed by control of the input gates consisting of transistors Q13–15, Q21 and resistor R13, which form AND-gate 22, and transistors Q18–20, Q23 and resistor R15, which form AND-gate 24.

Initially, the effects of the /RESET input 14 on the input register 30 will be described when the input register 30 is in the SET state. Transistors Q18–20 and Q23 with resistor R15 form the negative-true AND-gate 24. This AND-gate 24 is enabled when the clock input CLK is in the logic 0 state (i.e. <+2.25 V). With such a CLK state, transistor Q19 will not conduct because its base is less positive than that of Q18. If /RESET is also in the logic 0 state, the base of transistor Q20 is also less positive than that of Q18. Thus the mirrored current of transistor Q23 will flow through Q18. The magnitude of the mirrored current of Q23 is set to approximately 60 uA. The collectors of transistors Q17 and Q18 are tied together, therefore the current of Q18 will be mirrored to the base of transistor Q17 through current mirror transistor Q11 causing a 600 mV voltage rise across resistor R12. In the SET state Q16 is conducting and its base is 400 mV more positive than the +2.50 V reference line. However, when transistor Q18 is activated, the base of transistor Q17 will be 600 mV more positive than the +2.50 V reference line and, therefore, it will also be 200 mV more positive than the base voltage of Q16. This voltage difference will cause Q16 to switch off and Q17 to switch on. When this has taken place, the combined currents of Q17 and Q18 will be 100 uA, causing the base voltage of Q17 to be 1000 mV more positive than the +2.50 V reference. Transistor Q17 is now conducting all the current of current mirror Q22 and R14. This state will be maintained even when the current of transistor Q18 is no longer aiding it keeping the input register 30 in the RESET state, which happens when the clock pulse becomes more positive than +2.25 V (i.e., at the leading edge of the positive clock pulse).

The circuits 22 and 24 are identical at both inputs 12 and 14 of the input register 30. Thus, the procedure of changing the input register state from RESET to SET while the clock input CLK is in the logic 0 state (<+2.25 V) is similar to the one described above except that this time the /RESET input has to be logic 1 (>+2.75 V) and the /SET input must be logic 0 (<+2.25 V).

Figure 4B:
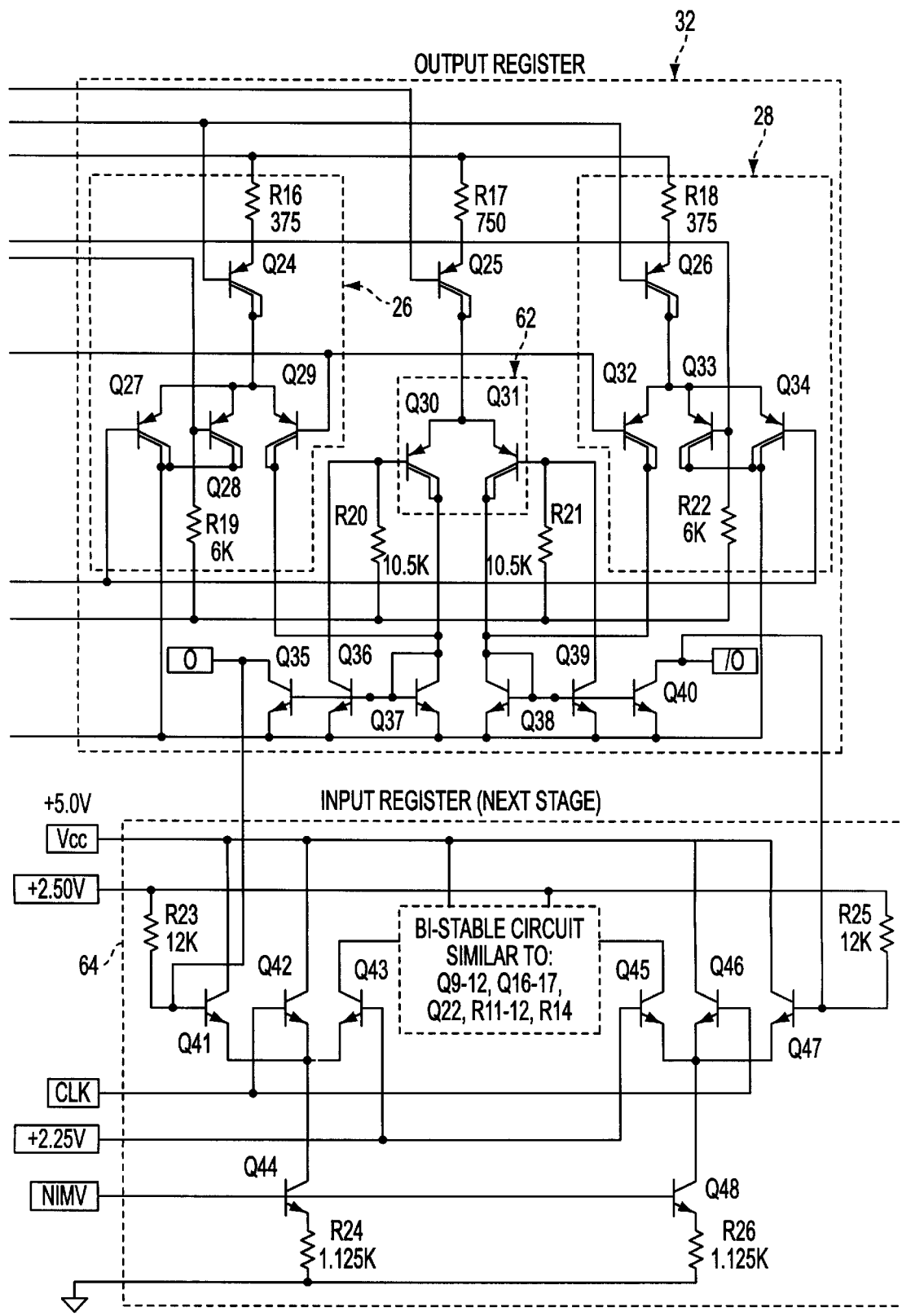
FIG. 4B is a detailed schematic diagram of the output register of the flip-flop of FIGS. 1A and 1B and the coupling circuit used to couple the output of one register stage to the input of second register stage.

With reference to FIG. 4B, the output register 32 is implemented by transistors Q24–40 and resistors R16–22. The flip-flop part of the register 32 is formed with transistors Q25, Q30–31, Q36–39 and resistors R17 and R20–21. Transistors 30 and 31 form a common emitter circuit 62. The 40 uA current sourced by Q25 either flows through Q30 or Q31 depending on whether the flip/flop is in the SET or RESET state. Supposing Q30 is conducting, its current is mirrored back to its base by current mirror Q37, Q36 causing a 400 mV drop at the base of Q30 with respect to the +2.50 V base bias voltage. Since the Q31 side of the output register is not conducting by assumption, the base of Q30 is 400 mV more negative than that of Q31 and this voltage difference is sufficient to lock the flip/flop in its SET state. Transistors Q24, Q27–29 and resistors R16, R19 form the input AND-gate 26 controlling the setting of the register 10, while the reset is controlled by AND-gate 28 formed by transistors Q26, Q32–34 and resistors R18 and R22.

If the output register is in the SET state, as long as the clock pulse is in the 0 logic state the AND-gates 26 and 28 associated with the output register 32 are inhibited. This is because transistors Q27 and Q34 are conducting, thus preventing transistors Q29 and Q32 from changing the state of the output register 32. If the input register 30 is in the RESET state the current of Q22 is flowing into Q11 via Q17, which will "mirror" it through Q12 into R22. Since both collectors of Q12 are connected together, the current flowing into R22 is twice that of Q22, i.e. 80 uA, making the base of transistor Q23 480 mV more positive than the +2.5 V bias source and 230 mV more positive than the +2.75 V gate reference. Transistors Q16, Q10 and Q9 are inactive by assumption, thus the base of Q28 is at +2.5 V.

When the clock pulse becomes more positive than +2.75 V, both transistors Q33 and Q34 will cease to conduct and the current of source Q26 (80 uA) will flow through Q32 into the common collectors of transistors Q31 and Q38. Even if the output register is in the SET state at this moment, the 80 uA reset current will offset the effects of the 40 uA "set" current established through the positive feedback loop (i.e. Q30, Q37, Q36 and R20). The AND-gate 26 on the SET side, however, will remain inactive because the base of transistor Q28 is more negative than that of Q29. Transistor Q28 will dump the current of source Q24 to ground.

The 80 uA current flowing from Q32 into the common collectors of transistors Q31 and Q38 will activate the current mirrors consisting of transistors Q38, Q39 and Q40. The collector of Q39 is connected to the base of Q31, thus the positive feedback loop is complete. Even after the clock pulse level drops below +2.75 V and Q32 is switched off, Q31 will conduct all the current from source Q25 (40 uA), thus latching the output register in the RESET state. Thus, the RESET state of the input register 30 has been transferred to the output register while the clock pulse amplitude was more positive than +2.75 V. The conditions are generally symmetric, that is, if the input register 30 is in the SET state the output register 32 is in the SET state when the clock pulse amplitude exceeds the +2.75 V level.

The outputs of the output register 32 are the Q35 and Q40 transistor current mirrors. Each transistor can sink 40 uA and the logic outputs of Q and /Q are negative true. Thus, when the output register 32 is SET, current mirror Q35 is active and capable of sinking 40 uA. In the RESET state Q40 is the activated current mirror transistor.

The coupling of subsequent stages similar to the input and output registers 30 and 32, respectively, is also illustrated in FIG. 4B in the form of coupling circuit 64. It is assumed that the input register of the next stage is controlled by dual input AND-gates shown as transistors Q41–44 and Q45–48 with resistors R23–24 and R25–26. The bases of transistors Q41 and Q47 are returned to the +2.5 V bias line through 12 kohm resistors R23 and R25. The collectors of Q35 (Q output) and Q40 (/Q output) are respectively connected to the bases of transistors Q41 and Q47. When either Q35 or Q40 is sinking 40 uA it will cause a 480 mV voltage drop with respect to +2.5 V either at the base of Q41 or Q47, which corresponds to a 230 mV drop from the +2.25 V reference voltage line. The operation of the gates and the associated input register during the time when the clock pulse is less positive than +2.25 V is identical to that of the input register 30 consisting of transistors Q9–Q23 and resistors R11–15.

It will be appreciated, then, that the register 10 incorporates positive feedback paths used in both the input register 30 and the output register 32. The current through a balanced emitter coupled circuit is predetermined by means of a current source and the current of the conducting side is "mirrored", or in effect reflected, back to the base of the same side by a current mirror of the opposite sense (i.e., it being understood that NPN common emitter transistors use PNP current mirrors in the feedback loop and vice versa).

Also advantageously, the setting and resetting of the registers 30 and 32 is controlled by AND-gates 22, 24, 26 and 28. Since the output of each AND-gate is a current source, each AND-gate 22–28 can inject sufficient current into the selected side of the register (i.e., to a selected one of Q16 or Q17 and a selected one of Q30 or Q31) to overcome the effect of the positive feedback acting on the opposite side (i.e., on the presently conducting transistor Q16 or Q17, and Q30 or Q31) and transfer the current of the emitter coupled register to the selected side. Once this is accomplished, the selected side will latch the new state by means of the positive feedback described herein.

Most importantly, the management of the input and output registers 30 and 32 is accomplished in a manner in which neither register is active when the clock pulse signal is within a predetermined, well-defined range. The input register 30 is enabled and the output register 32 is disabled with the low level clock pulse (inactive clock state). An intermediate range of clock pulse levels are provided at which both registers 30 and 32 are inhibited, but at which time the last state of the inputs at the input register 30 is latched into the input register as the clock pulse level crosses the threshold from enabling the input to disabling the input. This register management helps to ensure that noise on the clock pulse line will not erroneously trigger one or the other of the registers 30 or 32. The state of the input register 30 which is equal to the last state of the inputs as the clock signal crosses the level from enabling to disabling the inputs is transferred to the output register 32 as the clock pulse level crosses the threshold from disabling the output register AND-gates 26 and 28 to enabling them. This control sequence ensures against the possibility of any race condition caused by time delays.

Figure 5A:
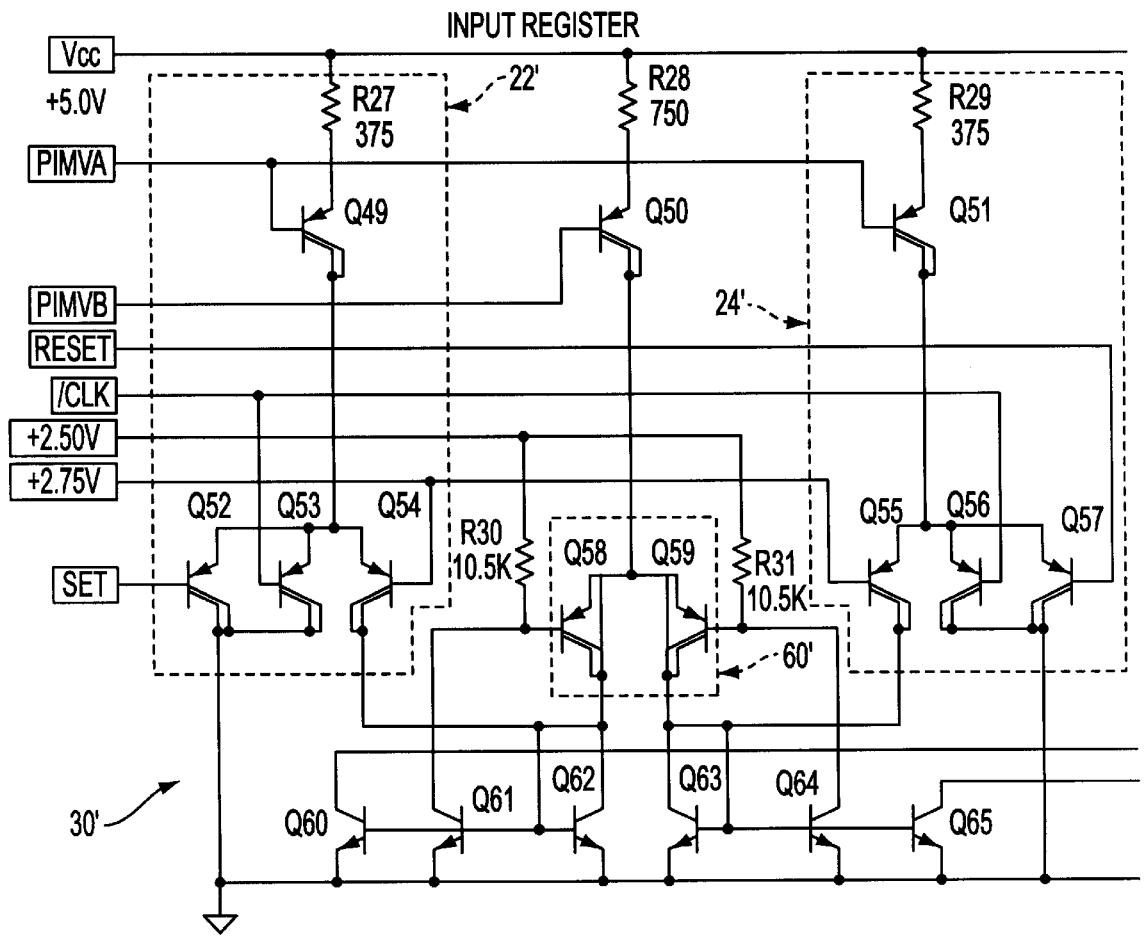
FIG. 5A is a detailed schematic diagram of the input register of the J-K flip/flop shown in FIGS. 2A and 2B.
Figure 5B:
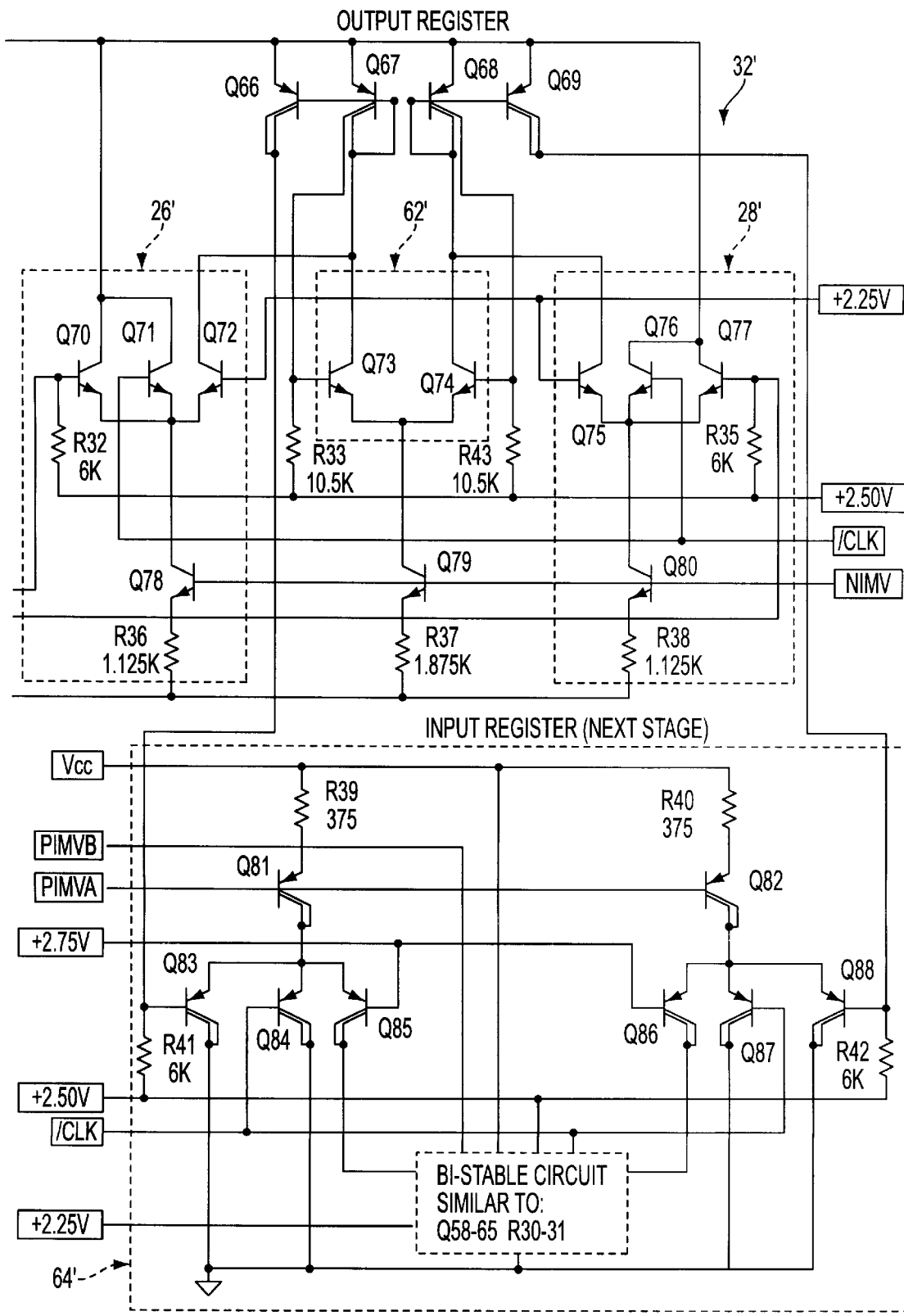
FIG. 5B is a detailed schematic diagram of the output register of the flip-flop shown in FIGS. 2A and 2B and a coupling circuit used to couple the output of one register stage to the input of a second register stage.

FIGS. 2A and 2B show the J-K flip/flop register 10' with positive true logic inputs 12' and 14' and a negative true clock pulse. The circuit implementation is illustrated in FIGS. 5A and 5B. Comparing FIGS. 4A,4B and 5A,5B and considering the description of operation of FIGS. 4A,4B, the operation of the register 10' will be apparent to one of ordinary skill in the art. The input register 30' (FIG. 5A) is formed by transistors Q49–Q65 and resistors R27–R31. The output register 32' (FIG. 5B) is formed by transistors Q66–Q80 and resistors R32–R38. In this case the input gates 22' and 24' and the input register 30' are configured with PNP transistors using NPN transistor collector loads and current mirrors. These circuits are virtually identical to those forming the output register 32 described herein.

In FIG. 5B, the output gates 26' and 28' and register 32' consist of NPN transistors with PNP transistors as collector loads and current mirrors. These circuits are virtually identical to those of the input gates 22, 24 and register 30 described therein.

In FIG. 5A, the common emitter circuit 60' of the input register 30' is formed by transistors Q58 and Q59. The common emitter circuit 62' in FIG. 5B is formed by transistors Q73 and Q74. In FIG. 5A the AND-gate 22' is formed by transistors Q52–Q54, Q49 and R27. The AND-gate 24' is formed by transistors Q55–Q57, Q51 and R29. In FIG. 5B, the AND-gate 26' is formed by transistors Q70–Q72, Q78 and resistors R32 and R36. The AND-gate 28' is formed by transistors Q75–Q77, Q80 and resistors R35 and R38. Coupling circuit 64' couples one register stage with a subsequent register stage.

The features of the register 10' shown in FIGS. 5A and 5B are similar to the register 10 of FIGS. 1B and 4A, 4B. The inactive level of the clock input is logic 1 (high) which enables the input gates 22', 24' and register 30' (FIG. 5A) and inhibits the output gates 26', 28' and register 32' (FIG. 5B). The logic 0 of the clock input inhibits the input gates 22', 24' and freezes the last state of the inputs in the input register 30'. While the clock changes from logic 1 to logic 0 there is a range of clock pulse voltage levels at which both input and output register gates 22'–28' are inhibited. When the clock pulse voltage level is low enough, the output gates 26', 28' will be enabled and the state of the input register 30' will be latched into the output register 32'.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A clocked register comprising:

an input register having first and second inputs, first and second outputs, and a clock input;

an output register having first and second inputs, first and second outputs, and a clock input, and responsive to said outputs of said input register;

said input register being active when a clock signal applied to said clock input thereof is below a first predetermined level and inactive when said clock signal is above said first predetermined level;

said output register being inactive when said clock signal applied to said clock input thereof is below a second predetermined level different from said first predetermined level and active when said clock signal is above said second predetermined level such that information in said input register is transferred to said outputs of said output register only when said output register is active; and said input and output registers both being inactive when said clock signal is at a level between said first and second predetermined levels.

2. The register of claim 1 wherein said first and second inputs of said input register are SET and RESET inputs.

3. The register of claim 1, wherein said input register comprises a common emitter circuit having a first and a second transistor.

4. The register of claim 3, wherein said input register further comprises first and second current mirror transistors to mirror current from said first and second transistors of said common emitter circuit.

5. The register of claim 4, wherein when said first transistor is conducting, collector current therethrough is mirrored by said first current mirror transistor providing positive feedback to said first transistor; and said second transistor being non-conducting when said first transistor is conducting.

6. The register of claim 4, wherein when said second transistor is conducting, collector current through said second transistor is mirrored by said second current mirror transistor back to said second transistor to provide positive feedback to said second transistor to maintain said second transistor in said conducting state; and wherein when said second transistor is conducting said first transistor is non-conducting.

7. The register of claim 4, further comprising a first resistor coupled to a base of said first transistor and a second resistor coupled to a base of said second transistor; and wherein when said first transistor is conducting, a voltage drop across said first resistor is added to a reference voltage between said first and second predetermined levels, wherein said reference voltage is coupled to said base of each of said first and second transistors; and said voltage drop across said first resistor providing positive feedback to said first transistor to maintain said first transistor in a conducting state while said second transistor is held non-conducting, and wherein when said second transistor is conducting, a voltage drop across said second resistor is added to said reference voltage to provide positive feedback to said second resistor to maintain said second transistor conducting while said first transistor is held non-conducting.

8. The register of claim 7, wherein said first and second current mirror transistors each comprise a dual collector transistor with the dual collectors of said first current mirror transistor being coupled to the collector and the base of said first transistor and the collectors of said second current mirror transistor being coupled to the base and collector of said second transistor.

9. The register of claim 4, further comprising a transistor for sourcing current to said first and second transistors.

10. A clocked register comprising:

first and second inputs and a clock input;

said inputs being responsive to signals applied thereto when a clock signal applied to said clock input is below a first predetermined level and non-responsive to signals applied thereto when said clock signal is above said first predetermined level; and when said clock signal is above a second predetermined level greater than said first predetermined level, information in an input section of said clocked register thereof is copied to an output section of said clocked register thereof; and when said clock signal is between said first and second predetermined levels said clocked register is inactive.

11. The register of claim 10, wherein said input section comprises an input register having first and second inputs and first and second outputs, and wherein said output section comprises an output register having first and second inputs and first and second outputs and being responsive to said outputs of said input register.

12. The register of claim 11, wherein said input register comprises first and second transistors, first and second current mirror transistors; and wherein when said first transistor is conducting current said first mirror transistor provides positive feedback to said first transistor to help maintain said first transistor conducting while said second transistor is nonconducting; and wherein when said second transistor is conducting said second current mirror transistor mirrors collector current of said second transistor back to said second transistor to help maintain said second transistor conducting while said first transistor is non-conducting.

13. The register of claim 12, further comprising a first resistor coupled to a base of said first transistor and a second resistor coupled to a base of said second transistor;

said first resistor providing a voltage drop when said first transistor is conducting, which is added to a reference voltage between said first and second predetermined levels to help maintain said first transistor in a conducting state, and said second resistor providing a voltage drop when said second transistor is conducting, which is added to said reference voltage to help maintain said second transistor in a conducting state.

14. The register of claim 13, wherein said first and second transistors comprise a common emitter circuit.

15. The register of claim 12, further comprising a third transistor for supplying a current to said first and second transistors.

16. The register of claim 11, wherein said output register includes a flip-flop circuit including a common emitter circuit having first and second transistors, a third transistor coupled to the emitters of said first and second transistors, fourth and fifth transistors coupled to said first transistor and sixth and seventh transistors coupled to said second transistor.

17. The register of claim 15, wherein when said first transistor is conducting when said second transistor is non-conducting, and wherein when said second transistor is conducting said first transistor is non-conducting.

18. The register of claim 16, wherein when said first transistor is conducting and said second transistor is not conducting, said flip-flop circuit is locked in a SET state, and when said second transistor is conducting and said first transistor is not conducting, said flip-flop is locked in a RESET state.

19. The register of claim 16, further comprising a coupling circuit for coupling one of said first or second outputs of said output register with an input of a second register stage.

20. A clocked register comprising:

an input register having first and second inputs, first and second outputs, and a clock input, an output register having first and second inputs, first and second outputs, and a clock input, and responsive to said outputs of said input register;

said input register being active when a clock signal applied to said clock input of said input register is at a first predetermined level and said output register being inactive when said clock signal applied at said clock input thereof is below said first predetermined level;

said output register being active only when said clock signal applied at said clock input thereof drops to a second predetermined level which is less than said first predetermined level; and said input and output registers both being inactive when said clock signal is between said first and second predetermined levels.

21. A clocked register comprising:

an input register having first and second inputs, first and second outputs, a clock input, and a common emitter circuit;

an output register, responsive to said first and second outputs of said input register, having first and second inputs, first and second outputs, a clock input, and a common emitter circuit;

said input register being active only when a clock signal applied to said clock input thereof is below a first predetermined level;

said output register only being active when said clock signal is above a second predetermined level different from said first predetermined level; and both said input register and said output register being inactive when said clock signal is at a level between said first and second predetermined levels.

* * * * *